United States Patent [19]

Nihei et al.

[11] Patent Number: 5,767,577
[45] Date of Patent: Jun. 16, 1998

[54] METHOD OF SOLDER BONDING AND POWER SEMICONDUCTOR DEVICE MANUFACTURED BY THE METHOD

[75] Inventors: Masayasu Nihei; Jin Onuki; Toshiaki Morita, all of Hitachi, Japan

[73] Assignee: Hitachi, Ltd., Tokyo, Japan

[21] Appl. No.: 568,234

[22] Filed: Dec. 6, 1995

[30] Foreign Application Priority Data

Dec. 16, 1994 [JP] Japan .................. 6-312995

[51] Int. Cl.$^6$ .................................. H01L 21/58
[52] U.S. Cl. .............. 257/707; 228/123.1; 228/124.1; 228/205
[58] Field of Search .............................. 257/706, 707; 228/219, 220, 221, 205, 124.1, 123.1

[56] References Cited

U.S. PATENT DOCUMENTS

| | | | |
|---|---|---|---|
| 4,709,844 | 12/1987 | Sekiguchi et al. | 228/221 X |
| 4,921,157 | 5/1990 | Dishon et al. | 228/221 X |
| 5,182,628 | 1/1993 | Izawa et al. | 257/707 |
| 5,377,902 | 1/1995 | Hayes | 228/219 X |

*Primary Examiner*—Kenneth J. Ramsey
*Attorney, Agent, or Firm*—Antonelli, Terry, Stout & Kraus, LLP

[57] ABSTRACT

A method of solder bonding suitable for a body having a large bonding surface area including the following steps of cleaning off the bonding surfaces in vacuum chamber by impinging accelerated particles such as argon ions through reverse spattering; then covering with an oxidation inhibiting thin silver film over the cleaned off bonding surfaces through spattering; further sandwiching a cleaned off solder foil between the bonding surfaces covered with the oxidation inhibiting thin sliver film; and heating the solder foil in vacuum upto the melting temperature thereof to complete the bonding, whereby defects in the solder bonding is reduced downto about 1/25 and life time of the solder bonding which is affected by thermal fatigue is prolonged twice in comparison with a conventional solder bonding method, thereby reliability of the solder bonding is greatly improved.

64 Claims, 3 Drawing Sheets

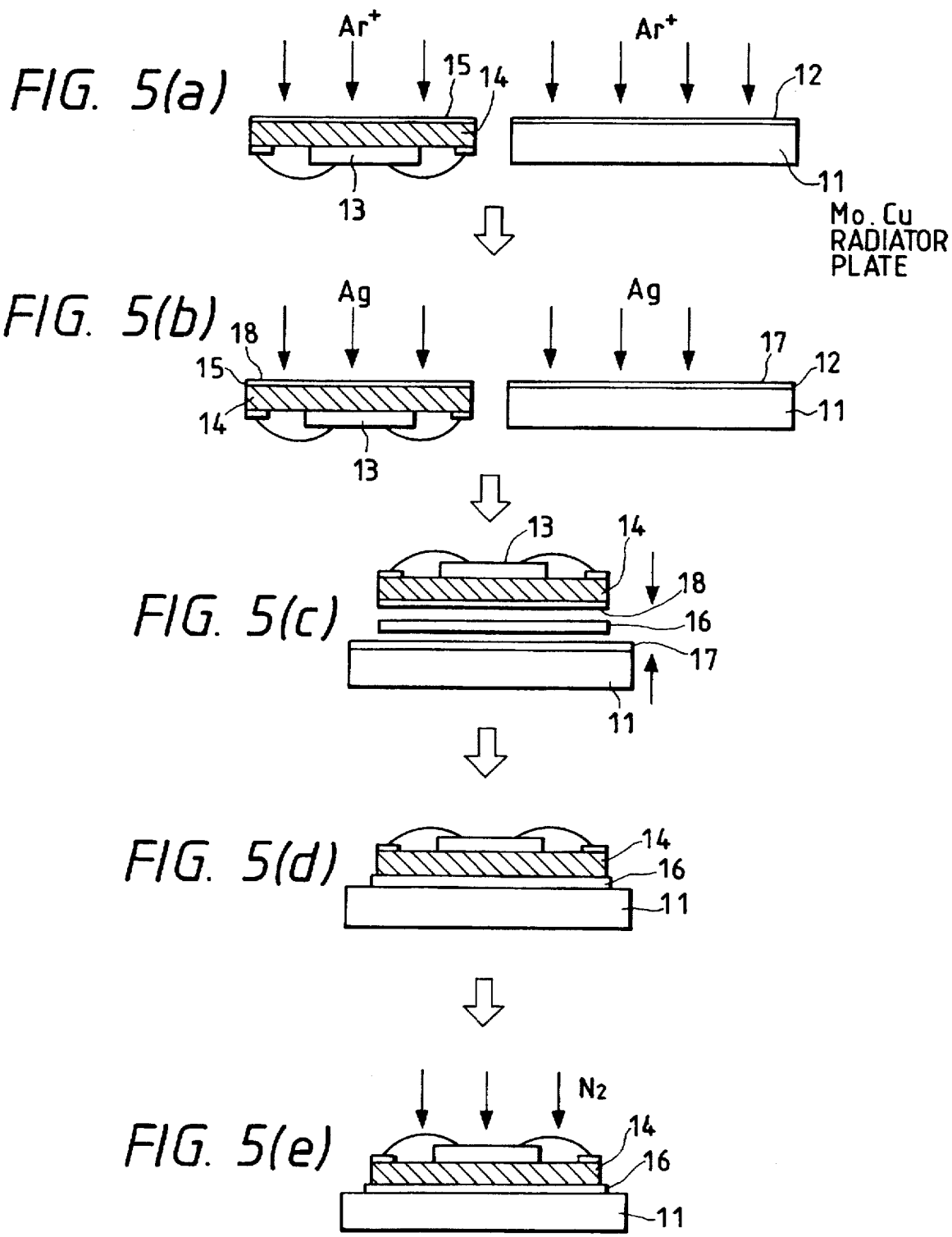

METHOD OF SOLDER BONDING AND POWER SEMICONDUCTOR DEVICE MANUFACTURED BY THE METHOD

BACKGROUND OF THE INVENTION

1. Field of the Invention

The present invention relates to a method of solder bonding in which a solder foil is sandwiched between facing surfaces to be bonded and is heated to complete bonding, in particular, relates to a method of solder bonding and manufacturing method of a solder bonding body and a power semiconductor device which permits bonding for a large facing areas with a high reliability, and relates to a power semiconductor device manufactured by the method and further relates to a device used for the method which performs cleaning of the surfaces to be bonded and forming a thin film thereon after the cleaning, in other words, a reverse spattering and spattering device.

2. Description of Related Art

Solder bonding is largely used in the field of industries, in particular, the solder bonding is indispensable for the manufacturing processes of power semiconductor devices and LSIs.

The solder bonding for the power semiconductor devices and the LSIs is usually performed through heat bonding under reducing hydrogen atmosphere without using such as flux so as to avoid adverse effects such as reduction of withstanding voltage and corrosion by the flux. However, since the solder bonding with a commonly used Sn—Pb eutectic solder is performed at a bonding temperature of about 230°, the interfaces between a bonding base material and a solder foil are insufficiently reduced, therefore oxides and impurities may remain thereon. Further, adsorbed organic materials or solid-solved impurity gases in the solder and the bonding base material are insufficiently discharged under the reducing hydrogen atmosphere. Because of these factors defects such as voids and blow holes are caused which extremely reduces reliability of the bonding. In particular, such phenomena are much remarkable for such as the power semiconductor devices having a large bonding area.

Further, JP-A-2-303676(1990) discloses a conventional bonding method in which a surface inactivating film on at least one of a solder material and a metal to be bonding is removed and cleaned off by an etching treatment to expose their active surfaces and then a soldering operation is performed.

However, even if the surface inactivating film is removed and cleaned off by the etching treatment, the soldering operation is performed while exposing the cleaned off surface, thus an oxide film is formed on the exposed surface which hinders the integration by the bonding. Although the above document discloses use of an inert gas atmosphere during the soldering operation, however since no reducing atmosphere is used, an oxide film is formed on the bonding surfaces because of a little amount of residual oxygen in a chamber as well as the wettability of the solder remains low and the reliability of the bonding is insufficient.

SUMMARY OF THE INVENTION

An object of the present invention is to resolve the above mentioned conventional problems and to provide a method of solder bonding and a manufacturing method of solder bonding bodies and power semiconductor devices which reduces bonding defects and increases bonding reliability, to provide a power semiconductor device manufactured by the method thereof and further to provide a device for performing the method thereof which permits to clean off the surfaces to be bonded and to form a thin film thereon.

A first aspect of the present invention which achieves the above object is a method of solder bonding which includes the steps of, cleaning off both bonding surfaces of one body to be bonded of which surface is constituted by nickel and of the other body to be bonded of which surface is constituted by nickel by impinging accelerated particles such as ions; cleaning off the surface of a solder foil by impinging accelerated particles such as ions; covering the cleaned off bonding surfaces of both the bodies to be bonded with an oxidation inhibiting film such as silver and gold; and sandwiching the cleaned off solder foil between the bonding surfaces covered by the oxidation inhibiting film and bonding integrally the bodies by heating the solder foil at the melting temperature thereof under vacuum atmosphere.

A second aspect of the present invention which achieves the above object is a method of solder bonding which includes the steps of, cleaning off both bonding surfaces of one body to be bonded of which surface is constituted by nickel and of the other body to be bonded of which surface is constituted by nickel by impinging accelerated particles such as ions; cleaning off the surface of a solder foil by impinging accelerated particles such as ions; covering the cleaned off bonding surfaces of both the bodies to be bonded with an oxidation inhibiting film such as silver and gold; sandwiching the cleaned off solder foil between the bonding surfaces covered by the oxidation inhibiting film and heating the solder foil at the melting temperature thereof under vacuum atmosphere; and thereafter bonding the bodies while introducing an inert gas under the solder melting condition and gradually returning the environment to the atmospheric pressure.

A third aspect of the present invention which achieves the above object is a method of solder bonding which includes the steps of, cleaning off both bonding surfaces of one body to be bonded of which surface is constituted by nickel and of the other body to be bonded of which surface is constituted by nickel by impinging accelerated particles such as ions; covering the cleaned off bonding surfaces of both the bodies to be bonded with an oxidation inhibiting film such as silver and gold; and sandwiching a solder foil between the bonding surfaces covered by the oxidation inhibiting film and bonding integrally the bodies by heating the solder foil at a heating velocity less than 1° C./min. upto the melting temperature thereof under vacuum atmosphere.

A fourth aspect of the present invention which achieves the above object is a method of solder bonding which includes the steps of, cleaning off both bonding surfaces of one body to be bonded of which surface is constituted by nickel and of the other body to be bonded of which surface is constituted by nickel by impinging accelerated particles such as ions; covering the cleaned off bonding surfaces of both the bodies to be bonded with an oxidation inhibiting film such as silver and gold; and sandwiching a solder foil between the bonding surfaces covered by the oxidation inhibiting film and heating the solder foil at a heating velocity less than 1° C./min. upto the melting temperature thereof under vacuum atmosphere; and thereafter bonding the bodies while introducing an inert gas under the solder melting condition and gradually returning the environment to the atmospheric pressure.

A fifth aspect of the present invention is characterized in that, in one of the first through fourth aspects of the present invention the film thickness of the oxidation inhibiting film is selected to be more than 0.05 μm.

A sixth aspect of the present invention is characterized in that, in one of the first through fifth aspects of the present invention the area of the solder foil is selected to be smaller than that of the bonding surface of one of the bodies to be bonded.

A seventh aspect of the present invention is directed to a solder bonding body formed by bonding both the bonding surfaces of one body to be bonded of which surface is constituted by nickel and of the other body to be bonded of which surface is constituted by nickel via a solder wherein the bonding integrally of both the bodies via the solder is performed via one of the method according to the first through sixth aspects of the present invention.

An eighth aspect of the present invention is directed to a manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via one of the methods according to the first through sixth aspects of the present invention.

A ninth aspect of the present invention is directed to a power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via one of the methods according to the first through sixth aspects of the present invention.

A tenth aspect of the present invention is directed to a device for cleaning off a surface to be bonded and for forming a thin film thereon which includes a container of which interia is to be kept under a reduced pressure condition; means for introducing an argon gas into the container to control the pressure therein; a target electrode and a reverse spattering electrode disposed in opposing manner in the container and a movable shielding plate disposed between the target electrode and the reverse spattering electrode so as to isolate spattering operation via the target electrode and reverse spattering operation via the reverse spattering electrode.

It is understood that defects in a solder bonding for a large area is caused by an insufficient discharge of gases adsorbed or dissolved in the solder and formation of defects such as blow holes when melting and bonding the solder. Accordingly, it is conceived if the heating and bonding are performed in vacuum the gases are sufficiently discharged and the defects such as blow holes can be prevented. However, under vacuum, in that, reduced pressure atmosphere the base material to be bonded and the solder foil are not at all reduced as well as there exists a little amount of oxygen in the chamber, therefore when the heat bonding is performed, the interfaces to be bonded are more oxidized than the original condition when received and the bonding frequently fails.

Accordingly, in the present invention the surfaces of the base material to be bonded and of the solder foil are cleaned by ions of such as argon, helium and xenon, and further the cleaned surface of the base material to be bonded is covered by an inactive metal such as silver which serves to inhibit oxidation, namely an oxidation inhibiting film, in the same chamber. Thereby, the cleaned condition of the base material to be bonded is kept and the oxidation inhibiting therefor is realized, as a result the bonding can be performed by heating under vacuum with no reducing function. Further, in the present invention the cleaned solder foil is sandwiched between the base materials of which surfaces have been cleaned and covered by such as silver and is heated in vacuum up to the melting temperature thereof and thereafter an inert gas such as nitrogen gas, argon gas and hydrogen gas is introduced to return the environment substantially to the atmospheric pressure. Thereby, remaining voids formed by a part of gases discharged from such as the solder foil are crushed by the pressure increase from vacuum to the atomospheric pressure to reduce defects in the bonding.

According to the first aspect of the present invention, the surfaces of the bodies to be bonded and of the solder foil are cleaned by impinging accelerated particles such as ions, therefore oxides and impurities on the surfaces are removed. Further the cleaned surfaces of the bodies to be bonded are covered by an oxidation inhibiting film such as silver, gold and platinum, therefore reformation of an oxide film is prevented without troubling to vary the atmosphere into reducing atmosphere in the following processes. The cleaned solder foil is then sandwiched between the bonding surfaces covered by the oxidation inhibiting film and is heated under reduced pressure atmosphere to bond the bodies to be bonded integrally, thereby, impurity gases contained in the solder foil are removed, the generation of voids and flow holes is prevented as well as the wettability of the solder is enhanced due to the oxidation inhibiting film such as silver and the reliability of the bonding is also enhanced.

According to the second aspect of the present invention, after heating the solder up to the melting temperature thereof according to the first aspect of the present invention, the bonding operation is performed while introducing an inert gas into the environment under the solder melting condition and gradually returning the environment to the atmospheric pressure, therefore the voids generated during the degasing process are pressed and crushed to thereby further reduce the defects in the bonding.

Different from the first and second aspects of the present invention, in the third and fourth aspects of the present invention the cleaning process of the surface of the solder foil is omitted, however the solder foil is heated under a reduced pressure atmosphere at a heating velocity of less than 1° C./min. upto the melting temperature thereof to bond the bodies to be bonded integrally, therefore the impurity gases adsorbed or solid solved in the solder foil are easily discharged to thereby reduce defects in the bonding.

According to the fifth aspect of the present invention, the film thickness of the oxidation inhibiting film is selected to be more than 0.05 μm, therefore the wettability of the solder is improved.

According to the sixth aspect of the present invention, the area of the solder foil is selected to be smaller than that of one of the bonding surface of the body to be bonded, therefore the solder melted by heating spreads over the entire surface to be bonded which facilitates degasing contained in the solder as well as easily provides a clean solder interface due to the movement of the melted solder to thereby further reduce defects in the bonding.

According to the seventh aspect of the present invention, the solder bonded body is bonded integrally via one of the methods according to the first through sixth aspects of the present invention, therefore defects in the bonding of the solder bonded body are reduced.

According to the eighth and ninth aspects of the present invention the power semiconductor device includes a large area of solder bonding portion, however defects in the bonding portion is reduced.

According to the tenth aspect of the present invention the surface to be bonded is easily cleaned and a thin film is easily formed over the cleaned surface.

BRIEF DESCRIPTION OF THE DRAWINGS

FIG. 5(a) through 5(e) are diagrams showing manufacturing steps of the power insulated gate bipolar transistor as shown in FIG. 4.

DETAILED DESCRIPTION OF THE EMBODIMENTS

Hereinbelow, an embodiment according to the present invention is explained in detail with reference to FIG. 1 through FIG. 3.

Figure 2:
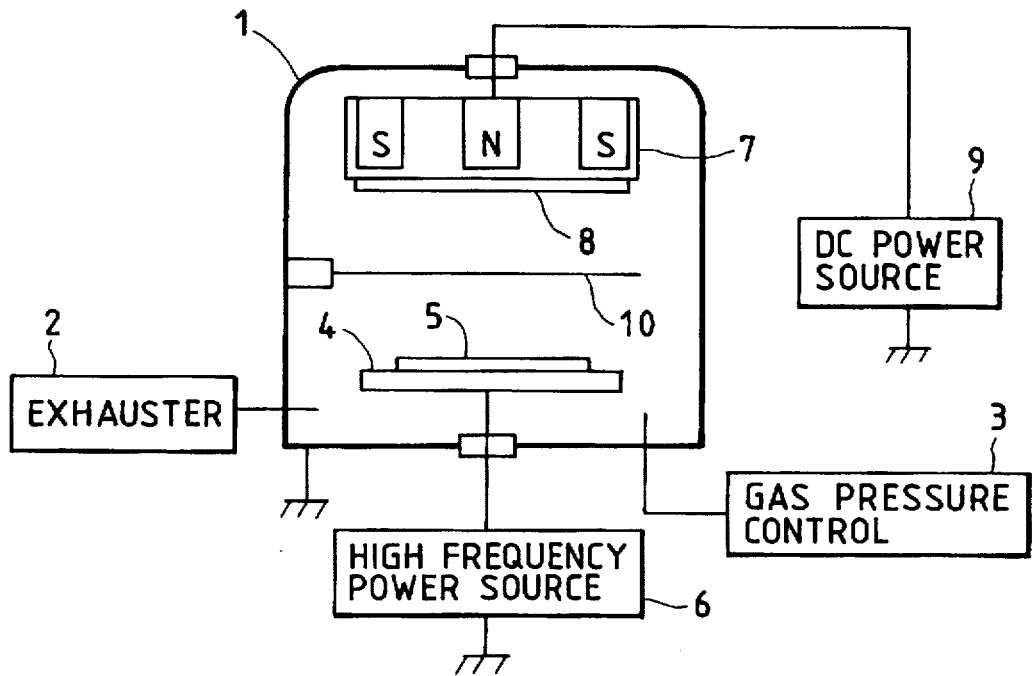
FIG. 2 is a schematic constitutional diagram showing a device for cleaning the surface to be bonded and for covering the cleaned surface with a thin film according to the present invention.

FIG. 2 shows a schematic constitutional diagram of a device for cleaning the surface to be bonded and for forming a thin film over the cleaned surface which is used for cleaning the surfaces of base materials to be bonded and for covering the cleaned surfaces with an oxidation inhibiting film of an inactive metal such as silver and gold. In FIG. 2, numeral 1 is a chamber, numeral 2 is an exhauster, numeral 3 is a gas pressure control unit for the chamber 1, numeral 4 is a reverse spattering electrode which serves for cleaning off a surface of a body to be bonded, numeral 5 is a base plate such as a base material to be bonded and a solder foil, numeral 6 is a reverse spattering use high frequency power source which applies a high frequency voltage to the reverse spattering electrode 4 while connecting the chamber 1 to the ground, numeral 7 is a target electrode for forming a thin film on the base plate 5, numeral 8 is a target material used for forming the thin film of such as silver and gold, numeral 9 is a DC power source for applying a positive DC voltage to the target electrode 7 while connecting the chamber 1 to the ground, numerals 10 is a shutter for preventing adverse effect between the cleaning operation and the film forming operation which is disposed substantially at the midway between the reverse spattering electrode 4 and the spattering electrode 7. In the present embodiments magnets are disposed behind the spattering electrode 7 so as to increase plasma density therearound so that a thin film having a high quality can be formed under $10^{-3} \sim 10^{-4}$ Torr with a high film forming velocity.

The operation of the above device is explained hereinbelow. When the pressure in the chamber 1 is reduced below $10^{-5}$ Torr by making use of the exhauster 2, argon gas is introduced into the chamber 1 by means of the gas pressure control unit 3 through which the pressure in the chamber 1 is controlled at about a level of $10^{-3}$ Torr. Subsequently, the reverse spattering electrode 4 is turned on and connected to the reverse spattering use high frequency source 6. When a high frequency voltage is applied to the reverse spattering electrode 4, plasma is generated between the reverse spattering electrode 4 and the grounded chamber 1 and the potential of the base plate 5 is rendered negative because of self biasing action of the applied high frequency voltage and is spattered off by argon gases of positive potential so that the surface of the base plate 5 is cleaned off. After performing the cleaning operation for a predetermined time, the reverse spattering use high frequency source 6 is turned off. Then the shutter 10 disposed between the base plate 5 and the target material 8 is opened and a predetermined positive DC voltage is applied to the spattering electrode 7 to spatter the spattering material 8 onto the base plate 5, thereby an oxidation inhibiting film of such as silver and gold is formed over the base plate 5 to cover the same and to prevent the oxidation thereof.

An investigation result on the defect in the bonding which is formed by making use of the above device is explained. The bonding conditions are as follows;

The base material to be bonded: 75×75×2 mm copper plate plated by nickel.

The solder foil: Sn60%-Pb40% and the solder foil size of 53×53×0.4 mm which corresponds to ½ of the surface of the base material to be bonded.

The cleaning the bese material to be bonded and silver film covering thereover: after evacuating the chamber down to $5\times10^{-7}$ Torr, argon gas was introduced, then the cleaning off operation was performed under argon gas atmsphere of $3\times10^{-3}$ Torr with a high frequency power of 500 W and a self biasing voltage of −500 V, and thereafter the silver film covering operation over the cleaned off surface is performed in the same chamber with a spattering power of 2 KW to form a silver film covering upto 2.5 μm. After the above operations the heat bonding was performed in another chamber serving as a vacuum bonding furnace, in that the vacuum bonding furnace was evacuated down to $5\times10^{-7}$ Torr, thereafter the bonding portion, in that the solder foil, was heated at a heating velocity of 1°~5° C./min. upto a temperature of 230° C. and held there for 20 min. Subsequently, nitrogen gas (argon gas and hydrogen gas can be used with substantially the same effect) was introduced into the vacuum bonding furnace to gradually return the same to the atmospheric pressure.

Figure 3:
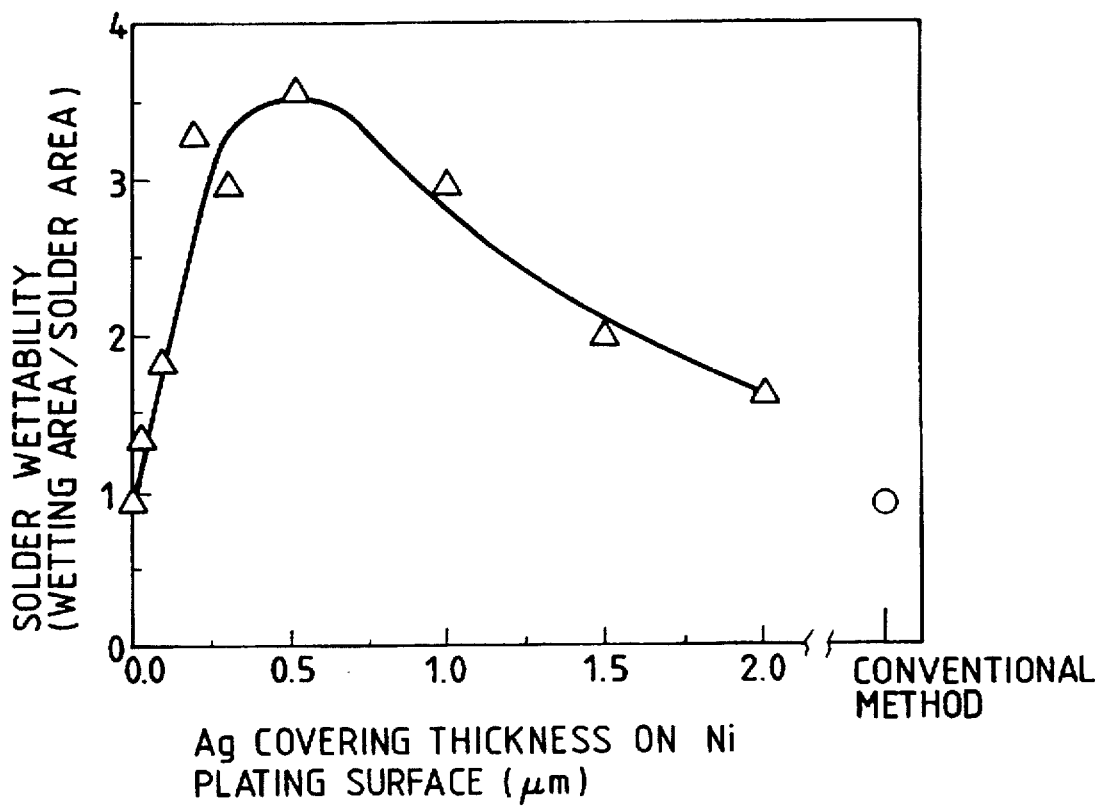
FIG. 3 is a diagram showing a relationship between silver covering thickness on a base material to be bonded and solder wettability thereof relating to the present invention.

FIG. 3 shows an influence of the silver covering thickness affecting wettability of solder which was performed as a preliminary experiment. The solder wettability, in that solder wetted area/original solder area, showed a maximum value of 3.5 at the silver covering film thickness of 0.5 μm and if the silver covering film thickness deviates from this point either thicker or thiner direction the solder wettability decreases. Accordingly, in the present embodiment the silver covering film thickness was determined at the thickness of 0.5 μm.

Figure 1:
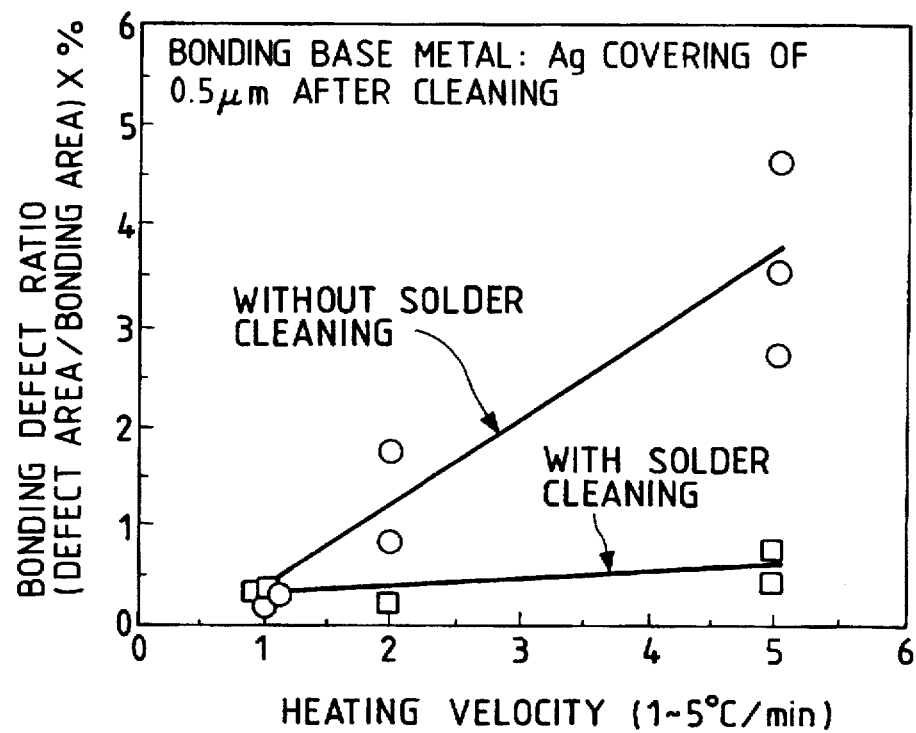
FIG. 1 is a diagram showing an affect of solder heating velocity on defects in the resultant bonding relating to the present invention.

FIG. 1 shows an experimental result performed by the present inventors in which an influence of solder heating velocity affecting on defects in the resultant bonding is investigated on bondings obtained by heating in vacuum a cleaned solder foil and a non cleaned solder foil separately sandwiched between base materials to be bonded of which surface were cleaned and covered by a thin silver film. With regard to the bonding using the non cleaned solder foil, the defects in the bonding at a solder heating velocity of 5° C./ min. was 4% and the defects in the bonding at a solder heating velocity of 1° C./min. was 0.3%, namely the lower the solder heating velocity is the less the defects in the bonding. On the other hand, with regard to the bonding using the cleaned solder the defects in the bonding was 0.3~0.5% with no substantial influence of the solder heating velocity and the defects in the bonding is greatly improved. The reasons why the solder heating velocity in the present embodiment exerts no substantial influence on the defects in the bonding is believed that gases and organic materials adhered on the solder foil are sufficiently removed via the cleaning process before the heat bonding process.

On the other hand, with regard to the bonding using the non-cleaned solder foil the defects in the bonding was reduced depending on the decrease of the solder heating velocity the reason of which is believed that gases adsorbed or solid solved in the solder foil are easily discharged when the solder heating velocity is lowered.

For the purpose of comparison with the bonding according to the present embodiment, a bonding formed by heating base materials to be bonded and a solder foil sandwiched therebetween both with no prior treatment in a hydrogen furnace according to a conventional method is prepared, the defects in the bonding formed according to the conventional method shows substantially the same value of 8% even if the solder heating velocity is varied between 1°~5° C./min. and the defects in the bonding could not be reduced through the variation of the solder heating velocity. In the above experiment investigating on the defects in the bonding an optimum silver covering film thickness is used, however, if a silver covering film thickness more than 0.05 µm is selected, practically acceptable bondings were obtained.

According to the above experimental results it is concluded that if either the base materials to be bonded are cleaned and are covered by a thin film such as silver over the cleaned surface thereof, then a cleaned solder foil is sandwiched therebetween and is heated in vacuum to complete the bonding or the base materials to be bonded are cleaned and are covered by a thin film such as silver over the cleaned surface thereof, then a non-cleaned solder foil is sandwiched therebetween and is heated in vacuum at a velocity of less than 1° C./min. upto the melting temperature thereof to effect degasing, the defects in the bonding can be reduced down about ⅕₂₅ (8%/0.3%). Further, through the introduction of nitrogen gas into the environment under the solder melting condition and returning the environment gradually to the atmospheric pressure, voids which are generated during the degasing process are crushed and eliminated.

Figure 4:
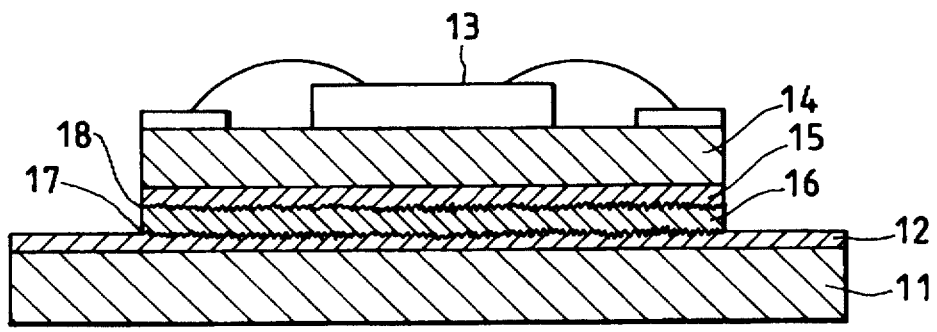
FIG. 4 is a diagram showing a schematic structure of one embodiment of power insulated gate bipolar transistors (IGBT) according to the present invention.

An application example of the solder bonding method according to the present invention on a power IGBT is explained hereinbelow. FIG. 4 shows a schematic cross sectional structure of a power IGBT manufactured according to the present invention. In FIG. 4, numeral 11 is a heat radiation plate for radiating heat and mounted on a heat sink and the heat radiation plate 11 is constituted by either a copper plate or a molybdenum plate and on the surface of which a nickel plating 12 is applied. Numeral 13 is a semiconductor element portion which is mounted on a wiring pattern formed on a ceramic plate 14 of electrically insulating material. Further, on the back face of the ceramic plate 14 a nickel plating 15 is applied. Numeral 16 is a bonding solder and between the solder 16 and the respective nickel platings silver films 17 and 18 are interposed.

FIG. 5(a) through FIG. 5(e) show process diagrams for manufacturing the power IGBT as shown in FIG. 4. After cleaning the bonding surfaces of the respective nickel platings 12 and 15 as explained in the above (FIG. 5(a)), the cleaned surfaces are covered by the silver films 17 and 18 having a thickness of 0.5 µm in the same chamber (FIG. 5(b)). Further, the both surfaces of the solder foil 16 are cleaned in the same manner in the same chamber. These treated heat radiation plate 11, ceramics plate 14 and solder foil 16 are taken out from the chamber, and the cleaned solder foil 16 is assembled to be sandwiched between the respective bonding surfaces covered by the silver films 17 and 18 (FIG. 5(c)). The assembly is loaded into a vacuum heating furnace, heated at a heating velocity of 5° C./min. upto a temperature of 230° C., held there for 20 min. and then the heating is terminated (FIG. 5(d)). Thereafter, nitrogen gas is further introduced into the vacuum heating furnace under the solder melting condition to gradually return the pressure therein to the atmospheric pressure (FIG. 5(e)). The defects in the thus obtained bonding was less than 0.5%. Further the resultant bonding was subjected to a thermal fatigue test in which electrical current carrying condition and forced cooling are repeated, and showed a twice larger solder life time than that formed according to a conventional solder bonding method.

As will be understood from the above explanation, according to the present invention the bonding surfaces are cleaned by accelerated particles such as ions and further covered by a oxidation inhibiting film such as silver and gold over the cleaned surfaces, then the solder foil is sandwiched between the bonding surfaces covered by the thin silver film and is heated in vacuum to complete the bonding, thereby the defects in the bonding are reduced down to about ⅕₂₅ in comparison with those formed according to the conventional method. Further, the solder life time at the bonding portion affected by the thermal fatigue thereof is prolonged about twice thereby the reliability of the bonding is greatly improved.

We claim:

1. A method of solder bonding comprising the steps of:

cleaning off both bonding surfaces of one body to be bonded of which surface is constituted by nickel and of the other body to be bonded of which surface is constituted by nickel by impinging accelerated particles;

cleaning off the surface of a solder foil by impinging accelerated particles;

covering the cleaned off bonding surfaces of both the bodies to be bonded with an oxidation inhibiting film of an inactive metal selected from one of silver, gold and platinum;

sandwiching the cleaned off solder foil between the bonding surfaces covered by the oxidation inhibiting film; and bonding integrally the bodies to be bonded by heating the solder foil at the melting temperature thereof under reduced pressure atmosphere.

2. A method of solder bonding comprising the steps of:

cleaning off both bonding surfaces of one body to be bonded of which surface is constituted by nickel and of the other body to be bonded of which surface is constituted by nickel by impinging accelerated particles;

cleaning off the surface of a solder foil by impinging accelerated particles;

covering the cleaned off bonding surfaces of both the bodies to be bonded with an oxidation inhibiting film of an inactive metal selected from one of silver, gold and platinum;

sandwiching the cleaned off solder foil between the bonding surfaces covered by the oxidation inhibiting film;

heating the solder foil at the melting temperature thereof under reduced pressure atmosphere; and bonding the bodies to be bonded while introducing an inert gas under the solder melting condition and gradually returning the environment to the atmospheric pressure.

3. A method of solder bonding comprising the steps of:

cleaning off both bonding surfaces of one body to be bonded of which surface is constituted by nickel and of the other body to be bonded of which surface is constituted by nickel by impinging accelerated particles;

covering the cleaned off bonding surfaces of both the bodies to be bonded with an oxidation inhibiting film of an inactive metal selected from one of silver, gold and platinum;

sandwiching solder foil between the bonding surfaces covered by the oxidation inhibiting film; and bonding integrally the bodies to be bonded by heating the solder foil at a heating velocity less than 1° C./min. up to the melting temperature thereof under reduced pressure atmosphere.

4. A method of solder bonding comprising the steps of:

cleaning off both bonding surfaces of one body to be bonded of which surface is constituted by nickel and of the other body to be bonded of which surface is constituted by nickel by impinging accelerated particles;

covering the cleaned off bonding surfaces of both the bodies to be bonded with an oxidation inhibiting film of an inactive metal selected from one of silver, gold and platinum;

sandwiching a solder foil between the bonding surfaces covered by the oxidation inhibiting film;

heating the solder foil at a heating velocity less than 1° C./min. up to the melting temperature thereof under reduced pressure atmosphere; and bonding the bodies to be bonded while introducing an inert gas under the solder melting condition and gradually returning the environment to the atmospheric pressure.

5. A method of solder bonding according to claim 1, wherein the film thickness of the oxidation inhibiting film is selected to be more than 0.05 μm.

6. A method of solder bonding according to claim 2, wherein the film thickness of the oxidation inhibiting film is selected to be more than 0.05 μm.

7. A method of solder bonding according to claim 3, wherein the film thickness of the oxidation inhibiting film is selected to be more than 0.05 μm.

8. A method of solder bonding according to claim 4, wherein the film thickness of the oxidation inhibiting film is selected to be more than 0.05 μm.

9. A method of solder bonding according to claim 1, wherein the area of the solder foil is selected to be smaller than that of the bonding surface of one of the bodies to be bonded.

10. A method of solder bonding according to claim 2, wherein the area of the solder foil is selected to be smaller than that of the bonding surface of one of the bodies to be bonded.

11. A method of solder bonding according to claim 3, wherein the area of the solder foil is selected to be smaller than that of the bonding surface of one of the bodies to be bonded.

12. A method of solder bonding according to claim 4, wherein the area of the solder foil is selected to be smaller than that of the bonding surface of one of the bodies to be bonded.

13. A method of solder bonding according to claim 5, wherein the area of the solder foil is selected to be smaller than that of the bonding surface of one of the bodies to be bonded.

14. A method of solder bonding according to claim 6, wherein the area of the solder foil is selected to be smaller than that of the bonding surface of one of the bodies to be bonded.

15. A method of solder bonding according to claim 7, wherein the area of the solder foil is selected to be smaller than that of the bonding surface of one of the bodies to be bonded.

16. A method of solder bonding according to claim 8, wherein the area of the solder foil is selected to be smaller than that of the bonding surface of one of the bodies to be bonded.

17. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 1.

18. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 2.

19. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 3.

20. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 4.

21. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 5.

22. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 6.

23. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 7.

24. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 8.

25. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 9.

26. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 10.

27. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 11.

28. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 12.

29. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 13.

30. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 14.

31. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 15.

32. A solder bonding body formed by bonding both the surfaces to be bonded of one body to be bonded of which surface is constituted by nickel and of the other body to be bonded of which surface is constituted by nickel via a solder wherein the bonding integrally of both the bodies via the solder is performed via the method according to claim 16.

33. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 1.

34. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 2.

35. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 3.

36. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 4.

37. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 5.

38. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 6.

39. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 7.

40. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 8.

41. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 9.

42. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 10.

43. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 11.

44. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 12.

45. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 13.

46. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 14.

47. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 15.

48. A manufacturing method of a power semiconductor device in which a heat radiation plate of which bonding surface is applied with a nickel plating and a ceramic substrate of which bonding surface is applied with a nickel plating and on which other surface a semiconductor element is mounted are bonded via a solder, wherein the bonding integrally of both the heat radiation plate and the ceramic substrate via the solder is performed via the method according to claim 16.

49. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 1.

50. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 2.

51. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 3.

52. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 4.

53. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 5.

54. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 6.

55. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 7.

56. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 8.

57. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 9.

58. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 10.

59. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 11.

60. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 12.

61. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 13.

62. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 14.

63. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 15.

64. A power semiconductor device manufactured by bonding a heat radiation plate of which bonding surface is applied with a nickel plating and a ceramic substrate of which bonding surface is applied with a nickel plating and on which other surface a semiconductor element is mounted via a solder, wherein the bonding integrally of both the heat radiation plate and the ceramic substrate via the solder is performed via the method according to claim 16.

* * * * *